(12) United States Patent
Heng et al.

(10) Patent No.: US 9,489,056 B2
(45) Date of Patent: Nov. 8, 2016

(54) OFF-AXIS DETECTION FOR PROXIMITY OR GESTURE SENSOR

(71) Applicant: Avago Technologies General IP (Singapore) Pte. Ltd., Singapore (SG)

(72) Inventors: Cherng Woei Heng, Negeri Sembilan (MY); James Costello, Singapore (SG); Wee Sin Tan, Singapore (SG)

(73) Assignee: Avago Technologies General IP (Singapore) Pte. Ltd., Singapore (SG)

( * ) Notice: Subject to any disclaimer, the term of this patent is extended or adjusted under 35 U.S.C. 154(b) by 318 days.

(21) Appl. No.: 14/186,949

(22) Filed: Feb. 21, 2014

(65) Prior Publication Data
US 2015/0241989 A1 Aug. 27, 2015

(51) Int. Cl.
*G06F 3/03* (2006.01)
*G06F 3/01* (2006.01)

(52) U.S. Cl.
CPC ............. *G06F 3/0304* (2013.01); *G06F 3/017* (2013.01)

(58) Field of Classification Search
CPC ..... G06F 3/0304; G06F 3/042; G06F 3/0421
USPC .......................... 250/221, 551; 345/173, 175
See application file for complete search history.

(56) References Cited

U.S. PATENT DOCUMENTS

| | | | |
|---|---|---|---|
| 2010/0109021 A1 | 5/2010 | Horio | |
| 2011/0084903 A1 | 4/2011 | Onishi | |
| 2013/0153755 A1 | 6/2013 | Pikkujamsa et al. | |
| 2014/0103199 A1* | 4/2014 | Loong | G01S 17/026 250/214.1 |

OTHER PUBLICATIONS

"Logical Sensors", available at https://sites.google.com/site/automatedmanufacturingsystems/Home/logical_sensors, Automated Manufacturing Systems, Aug. 11, 2009, 21 pages.

* cited by examiner

*Primary Examiner* — Kevin Pyo (57) ABSTRACT

An optical sensor for detecting at least one of proximity and gesture is disclosed. The optical sensor is configured to detect or sense an object that is located out of the sensor's primary axis. This off-axis detection is facilitated by projecting light emitted by a light source away from the sensor's primary axis and away from the direction in which the light was originally emitted by the light source. The light detector is also configured to detect the light that is being projected off-axis.

19 Claims, 12 Drawing Sheets

OFF-AXIS DETECTION FOR PROXIMITY OR GESTURE SENSOR

FIELD OF THE DISCLOSURE

The present disclosure is generally directed toward sensors and more specifically toward optical sensors for detecting proximity or gesture.

BACKGROUND

Mobile communication devices, such as, for example, cellular telephones, smartphones, digital audio or video players, portable navigation units, laptop computers, personal digital assistants, tablets, netbooks, or the like are becoming increasingly popular. These devices may include, for example, a variety of sensors to support a number of applications in today's market. A popular market trend in sensor-based mobile technology may include, for example, applications that sense or recognize one or more aspects of a motion of a user relative to a mobile communication device and use such aspects as a form of a user input. For example, certain applications may sense or recognize waving gestures, finger gestures, air signatures, and the like of a user and may use such gestures as inputs representing various user commands in selecting music, playing games, estimating a location, determining navigation route, browsing through digital maps or Web content, authorizing transactions, or the like.

Proximity sensors are similar to some gesture sensors on mobile communication devices in that proximity sensors may also utilize light and imagers to detect a user's proximity to the sensor. Proximity can also be used as inputs to applications on the mobile communication device, although proximity inputs typically provide less information than gesture inputs. In other words, proximity inputs are usually binary (the user is either within a detectable proximity of the sensor or not) whereas gesture inputs may correspond to detecting certain motions or actions of a user with the gesture sensor.

A drawback to currently-available light-based sensors (proximity or gesture) is that the sensors are only capable of detecting proximity or gesture within a small detection window. More problematic is that the small detection window is required to be directly over the sensor itself. This means that user inputs at the sensor can only be detected when the user places a part of their body (or some other object) directly over the sensor. Requiring the user to provide such inputs in a small detection window has, to this point, limited the usefulness of light-based sensors in mobile communication devices. In particular, most users are interacting with a keypad or touch screen of the mobile communication device and do not want to have to change their interaction zone to some other location that is not coincident with the keypad or touch screen.

BRIEF DESCRIPTION OF THE DRAWINGS

The present disclosure is described in conjunction with the appended figures.

DETAILED DESCRIPTION

The ensuing description provides embodiments only, and is not intended to limit the scope, applicability, or configuration of the claims. Rather, the ensuing description will provide those skilled in the art with an enabling description for implementing the described embodiments. It being understood that various changes may be made in the function and arrangement of elements without departing from the spirit and scope of the appended claims.

Various aspects of the present disclosure will be described herein with reference to drawings that are schematic illustrations of idealized configurations. As such, variations from the shapes of the illustrations as a result, for example, manufacturing techniques and/or tolerances, are to be expected. Thus, the various aspects of the present disclosure presented throughout this document should not be construed as limited to the particular shapes of elements (e.g., regions, layers, sections, substrates, etc.) illustrated and described herein but are to include deviations in shapes that result, for example, from manufacturing. By way of example, an element illustrated or described as a rectangle may have rounded or curved features and/or a gradient concentration at its edges rather than a discrete change from one element to another. Thus, the elements illustrated in the drawings are schematic in nature and their shapes are not intended to illustrate the precise shape of an element and are not intended to limit the scope of the present disclosure.

It will be understood that when an element such as a region, layer, section, substrate, or the like, is referred to as being "on" another element, it can be directly on the other element or intervening elements may also be present. In contrast, when an element is referred to as being "directly on" another element, there are no intervening elements present. It will be further understood that when an element is referred to as being "formed" or "established" on another element, it can be grown, deposited, etched, attached, connected, coupled, or otherwise prepared or fabricated on the other element or an intervening element.

Furthermore, relative terms, such as "lower" or "bottom" and "upper" or "top" may be used herein to describe one element's relationship to another element as illustrated in the drawings. It will be understood that relative terms are intended to encompass different orientations of an apparatus in addition to the orientation depicted in the drawings. By way of example, if an apparatus in the drawings is turned over, elements described as being on the "lower" side of other elements would then be oriented on the "upper" side of the other elements. The term "lower" can, therefore, encompass both an orientation of "lower" and "upper" depending of the particular orientation of the apparatus. Similarly, if an apparatus in the drawing is turned over, elements described as "below" or "beneath" other elements would then be oriented "above" the other elements. The terms "below" or "beneath" can therefore encompass both an orientation of above and below.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and this disclosure.

As used herein, the singular forms "a," "an," and "the" are intended to include the plural forms as well, unless the context clearly indicates otherwise. It will be further understood that the terms "comprise," "comprises," and/or "comprising," when used in this specification, specify the presence of stated features, integers, steps, operations, elements, and/or components, but do not preclude the presence or addition of one or more other features, integers, steps, operations, elements, components, and/or groups thereof. The term "and/or" includes any and all combinations of one or more of the associated listed items.

Furthermore, various descriptive terms used herein, such as "transparent" should be given the broadest meaning possible within the context of the present disclosure. For example, something that is described as being "transparent" should be understood as having a property allowing no significant obstruction or absorption of electromagnetic radiation in the particular wavelength (or wavelengths) of interest, unless a particular transmittance is provided.

Figure 1:
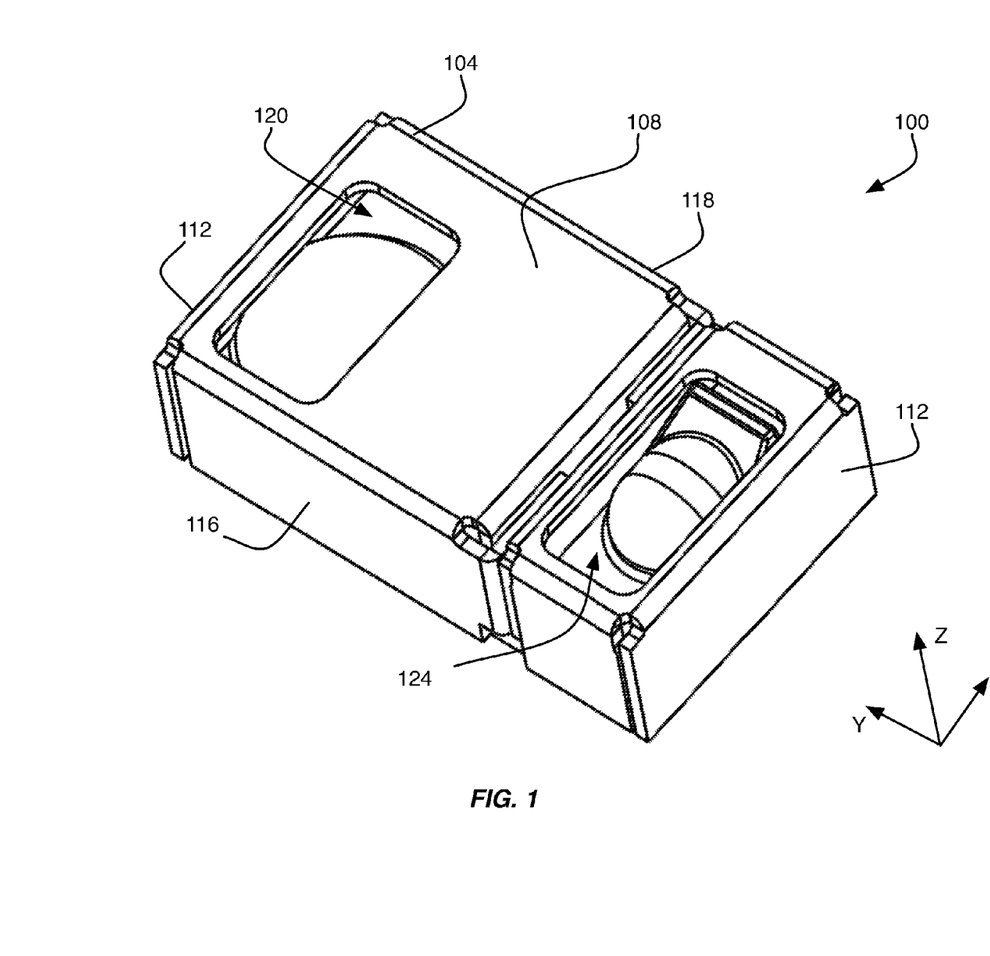
FIG. 1 depicts an isometric view of a sensor in accordance with embodiments of the present disclosure.

With reference initially to FIG. 1, an example of a first sensor 100 will be described in accordance with embodiments of the present disclosure. The sensor 100 may be configured to operate as either a gesture sensor or a proximity sensor without departing from the scope of the present disclosure. The sensor 100 is shown to include a housing 104 having a top surface 108, a plurality of side faces 112, a front face 116, and a back face 118. In some embodiments the housing 104 is partitioned into two sections—a transmitter side and a receiver side. Accordingly, the housing 104 is depicted as further including a receiver hole 120 in the top surface 108 and a transmitter hole 124 in the top surface 108.

In the example of the first sensor 100, the top surface 108 is shown to be substantially parallel with the depicted x-y plane, the side faces 112 are shown to be substantially parallel with the x-z plane, and the front face 116 and back face 118 are shown to be substantially parallel with one another and with the y-z plane. Thus, the top surface 108 is substantially orthogonal with the side faces 112, which are both substantially orthogonal with the front face 116 and back face 118.

In accordance with at least some embodiments, the housing 104 may be constructed of any type of material that is suitable for attenuating or otherwise blocking light transmitted by a light source of the sensor 100. Specifically, the housing 104 may provide two functions for the sensor 100: (1) protection of the sensor 100 components and (2) preventing light from traveling directly from a light source of the sensor 100 to a light detector of the sensor 100. Instead, the holes 120, 124 may be configured as the light path for the sensor 100 and any light detected at the light detector may first travel through the transmitter hole 124, then impact or reflect off an object, then travel through the receiver hole 120. Any other light emitted by the light source of the sensor 100 is substantially inhibited from traveling to the light detector.

Figure 2A:
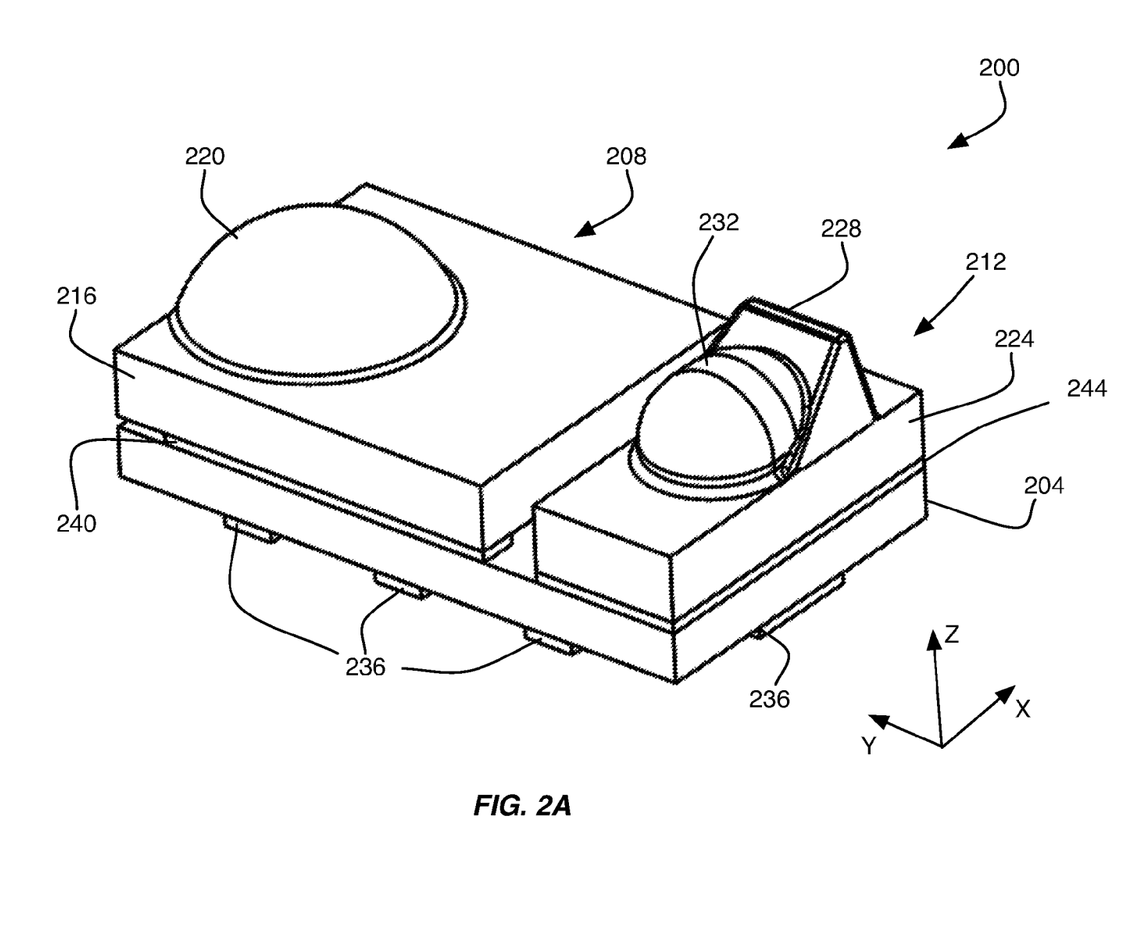
FIG. 2A depicts a first isometric view of a sensor sub-assembly in accordance with embodiments of the present disclosure.
Figure 2B:
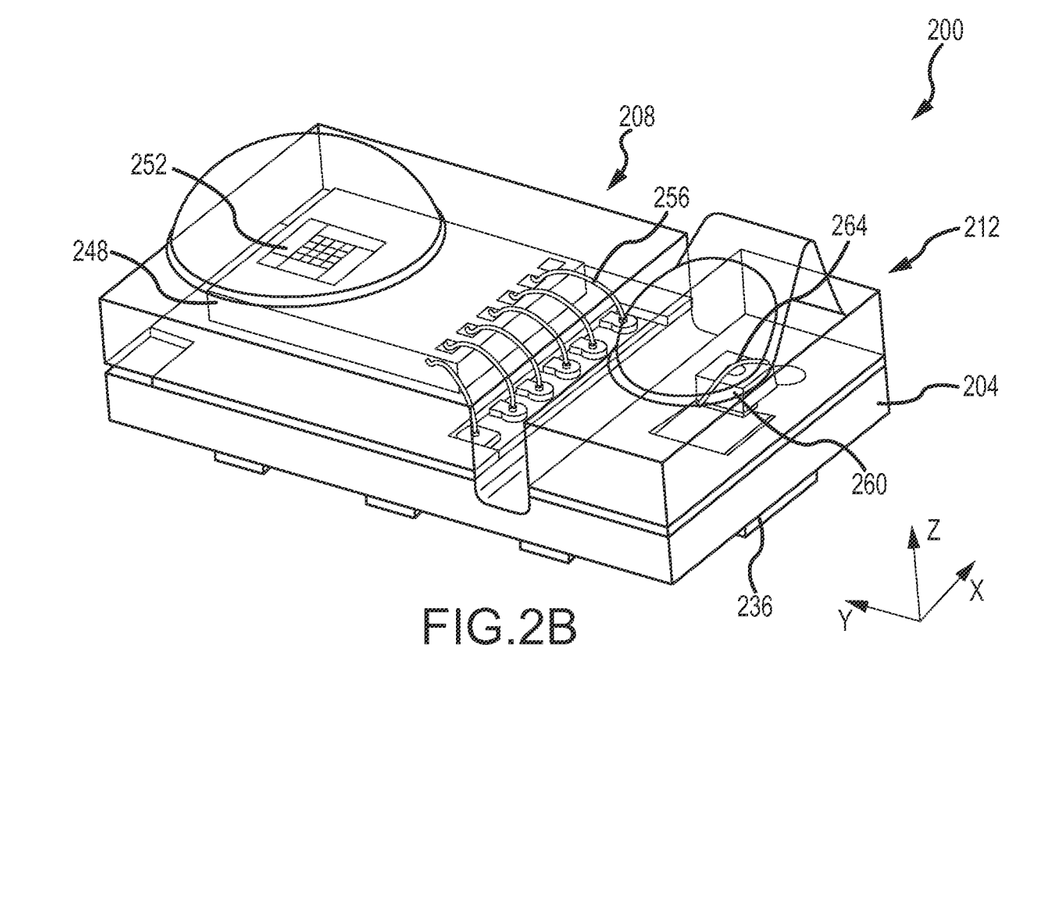
FIG. 2B depicts a second isometric view of a sensor sub-assembly in accordance with embodiments of the present disclosure.

With reference now to FIGS. 2A and 2B, additional components of the first sensor 100 will be described in accordance with embodiments of the present disclosure. In particular, FIG. 2A shows a sensor sub-assembly 200 or the sensor components that are housed within housing 104. The sensor sub-assembly 200 is shown to include a substrate 204 with a receiver side 208 and transmitter side 212 mounted thereon.

The receiver side 208 is shown to include a receiver mold component 216. As seen in FIG. 2B, the receiver side 208 may also comprise a receiver Integrated Circuit (IC) 248, a light detector 252, and bonding wires 256 within the receiver mold component 216. In some embodiments, the receiver mold component 216 corresponds to a plastic or similar type of material that is molded around the receiver IC 248, light detector 252, and bonding wires 256, thereby encapsulating and protecting the components contained therein. In some embodiments, the receiver lens 220 may be integral to the receiver mold component 216, meaning that the receiver lens 220 may be molded and formed of the same material as the rest of the receiver mold component 216, but with a particular lens shape (e.g., a dome shape) that substantially focuses light toward the light detector 252. In such an embodiment, the material of the receiver mold component 216 may be substantially transparent to wavelengths of light emitted by the transmitter side 212. As an example, the receiver mold component 216 and/or receiver lens 220 may be substantially capable of allowing Infrared (IR) light or near-IR light to pass therethrough. In other embodiments, the receiver lens 220 is constructed of a different material from the rest of the receiver mold component 216. In such a construction, the lens 220 may be substantially transparent to light emitted by the transmitter side 212 whereas the receiver mold component 216 may allow or block the light emitted by the transmitter side 212. It may be generally desirable to utilize the construction where the receiver lens 220 is integral to the receiver mold component 216 to minimize assembly costs.

As seen in FIG. 2A, an intermediate layer 240 may be provided between the receiver mold component 216 and the substrate 204. The intermediate layer 240 may include structural components that support the receiver mold component 216 on the substrate 204. The structural components of the intermediate layer 240 may include an insulative material that substantially supports the weight of the receiver IC 248 on the substrate 204 as well as provides an electrical separation between the receiver IC 248 and substrate 204. Electrical connections between contacts of the substrate 204 and the receiver IC 248 may be facilitated by the bonding wires 256 that extend from a top surface of the receiver IC 248 to a top surface of the substrate 204. In some embodiments, the area provided on the top surface of the substrate 204 that is used for establishing electrical connections with the receiver IC 248 may be absent the insulative material of the intermediate layer 240.

In some embodiments, the substrate 204 may correspond to a Printed Circuit Board (PCB) or the like that supports the components of the receiver side 208 and transmitter side 212. The substrate 204 may either be rigid or flexible. Moreover, the substrate 204 may comprise one or more conductive vias (not shown) that extend from a top surface of the substrate 204 to an opposing bottom surface of the substrate 204. The bottom surface of the substrate 204 may further include one or more bonding pads 236 that enable the sensor 100 to be electrically connected to a larger PCB or some other electrical device. Thus, the electrical signals carried by the bonding wires 256 may be carried through the substrate 204 to the bonding pads 236 where they can be communicated to a larger circuit or set of circuits. In some embodiments, the bonding pads 236 may correspond to surface mount leads that enable the sensor 100 to be surface mounted to another PCB. Alternatively or additionally, the bonding pads 236 may comprise an array of bonding elements (e.g., a Ball Grid Array (BGA) or the like) that facilitate electrical connectivity between the sensor 100 and another PCB.

The transmitter side 212 of the sensor sub-assembly 200, much like the receiver side 208, may comprise a transmitter mold component 224 and one or more optical elements configured to direct light emitted by a light source of the transmitter side 212. In the depicted embodiment, the optical elements of the transmitter side 212 include a lens having a wedge portion 228 and a pill portion 232 that is seamlessly integrated with the wedge portion 228. As will be discussed in further detail herein, the unique configuration of the wedge portion 228 and pill portion 232 enable the light transmitted by a light source 260 of the transmitter side 212 to be transmitted at an off-axis angle with respect to the major surface of the substrate 204 and with respect to a light-emitting surface of the light source 260.

Like receiver mold component 216, the transmitter mold component 224 may be constructed of an optically-transparent and moldable material such as plastic, epoxy, glass, etc. In some embodiments, the wedge portion 228 and/or pill portion 232 may both be constructed from the same material as the transmitter mold component 224 and may even be integral with the rest of the transmitter mold component 224. In other words, a single continuous material may be molded to create the wedge portion 228, the pill portion 232, and the rest of the transmitter mold component 224 that extends to the boundaries of the substrate 204. It should be appreciated, however, that one or both of the wedge portion 228 and pill portion 232 may be constructed separate from the rest of the transmitter mold component 224 and may be attached thereto during a later manufacturing step. The transmitter mold component 224 may substantially encapsulate and protect the light source 260 and wire bonds established between the light source 260 and the substrate 204.

Also like the receiver mold component 216, the transmitter mold component 224 may be attached to the substrate 204 by an intermediate layer 244, which may actually correspond to the same material as the intermediate layer 240. Furthermore, one or more bonding wires 264 may be used to electrically connect the light source 260 to the substrate 204. One or more electrical signals used to control operation of the light source 260 may be provided to the light source 260 via an external circuit (e.g., a sensor driver) that is connected to the light source 260 via the bonding pads 236. In other words, the signals transmitted to the light source 260 may be carried from the bonding pads 236 through conductive vias in the substrate 204 to the bonding wire 264 and eventually to the light source 260.

In accordance with at least some embodiments of the present disclosure, the light source 260 may correspond to any component or collection of components capable of producing and emitting light. As non-limiting examples, the light source 260 may comprise a Light Emitting Diode (LED), an array of LEDs, a laser diode, a collection of laser diodes, or the like. As a further non-limiting example, the light source 260 may correspond to a semiconductor-type light-emitting device that may or may not be constructed using flip-chip technology. In some embodiments, the light source 260 comprises a primary light-emitting surface (e.g., a top surface opposite the top surface of the substrate 204) that is substantially parallel or planar with the x-y plane.

In accordance with at least some embodiments of the present disclosure, the light detector 252 may correspond to a photodetector, photodiode, a reverse-biased LED, a photoresistor, an image sensor (e.g., a CMOS image sensor), a Charge-coupled device (CCD), or the like that is mounted on the top surface of the receiver IC 248. As a more specific, but non-limiting example, the light detector 252 may correspond an integrated optical circuit established on the IC 248 and a photodetector mounted on the IC 248.

Figure 3:
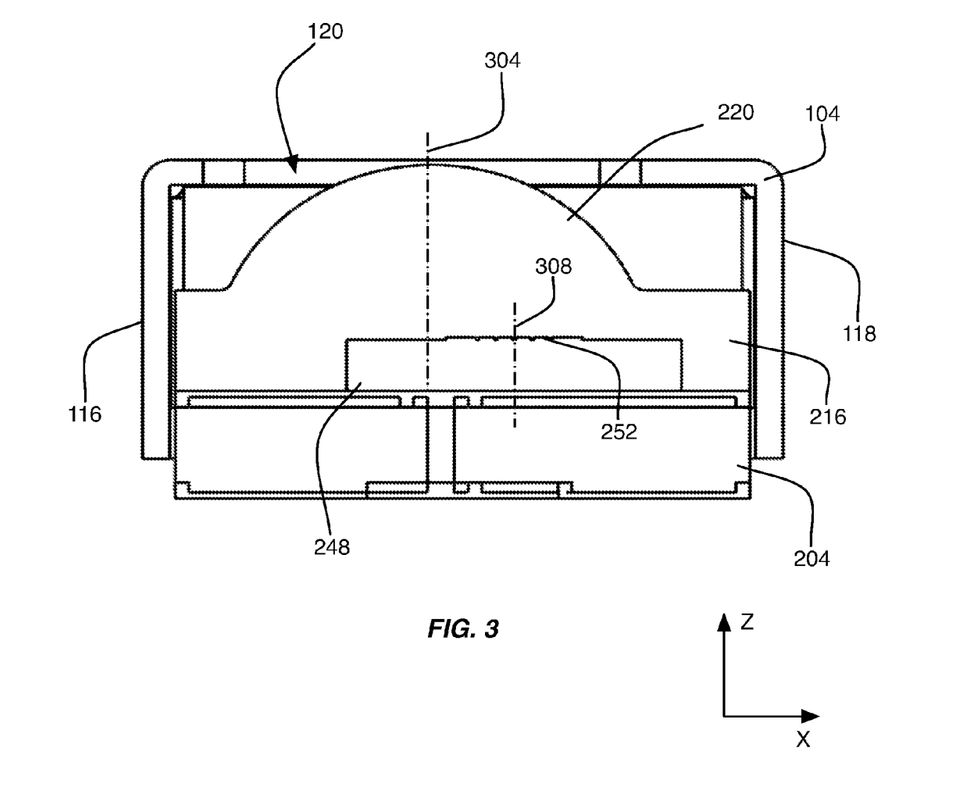
FIG. 3 is a cross-sectional elevational view in the x-z plane of a light detector incorporated in a sensor in accordance with embodiments of the present disclosure.

With reference now to FIG. 3, additional details of the components included in the receiver side 208 will be described in accordance with embodiments of the present disclosure. The cross-sectional view of FIG. 3 along the x-z plane shows how the light detector 252 can be offset relative to the receiver lens 220 to help adjust the viewing angle of the receiver side 208. Even more specifically, the lens center 304 is shown to be offset relative to a light detector center 308. In some embodiments, no portion of the light detector 252 intersects or lies directly beneath the lens center 304. By offsetting the lens center 304 from the light detector center 308, the viewing window the receiver side 208 is directed away from directly above the light detector 252 as in prior art sensors. Instead, the viewing window is directed toward the front face 116 of the housing 104, thereby enabling the light detector 252 to detect objects that do not lie directly above the lens center 304 or the light detector center 308. In other words, the sensor 100 can be configured to view objects that are beyond the front face 116 of the housing 104.

Another feature shown in FIG. 3 is that the receiver hole 120 is offset relative to a center of the substrate 204. Said another way, the receiver hole 120 is established on the top surface 108 of the housing 104, but is biased toward the front face 116, which means that the receiver hole 120 is closer to the front face 116 than the back face 118. Likewise, the lens center 304 is centered within the receiver hole 120, which means that the receiver lens 220 is biased toward the front face 116 of the housing. Conversely, the light detector center 308 is biased toward the back face 118, thereby creating an optical path that is angular relative to the top surface 108 of the housing 104 even though the light-detecting surface of the light detector 252 is substantially planar with the x-y plane, the optical path for the light detector 252 is not parallel with the z-axis.

Figure 4:
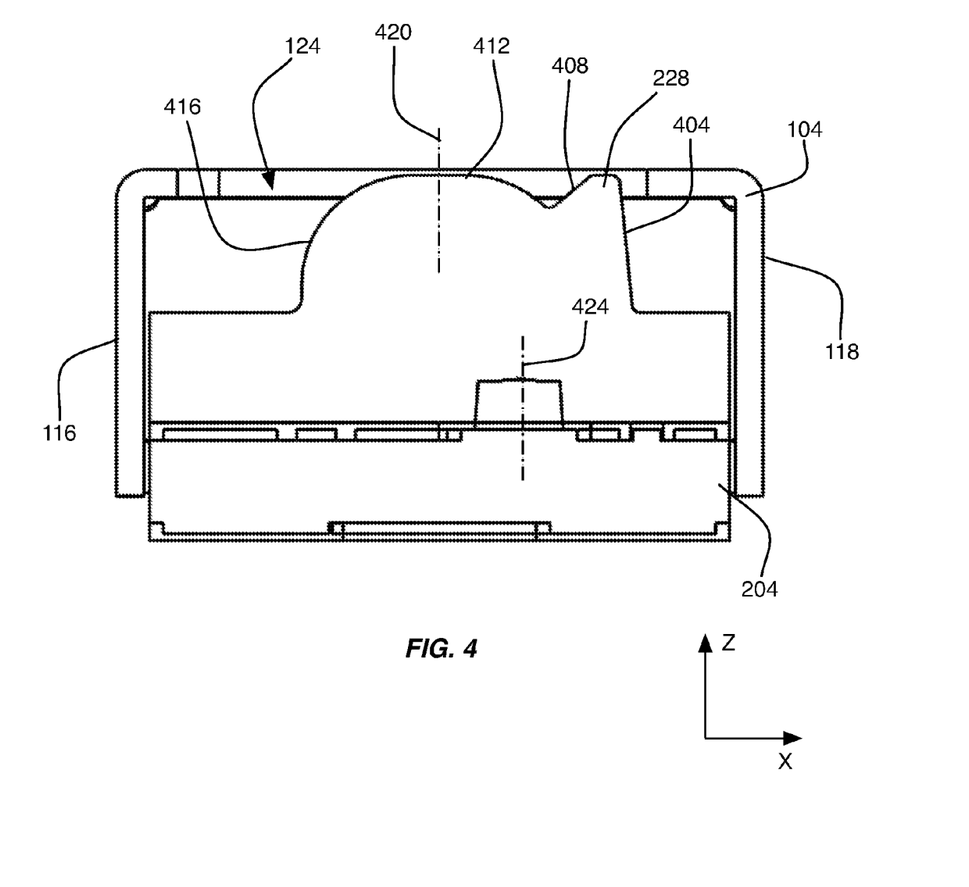
FIG. 4 is a cross-sectional elevational view in the x-z plane of a light source incorporated in a sensor in accordance with embodiments of the present disclosure.

With reference now to FIG. 4, additional details of the components included in the transmitter side 212 will be described in accordance with embodiments of the present disclosure. The cross-sectional view of FIG. 4 along the x-z plane shows how the light source 260 can be offset relative to the lens elements of the transmitter side 212 as well as the substrate 204. More specifically, and much like the receiver side 208, the transmitter side 212 is configured such that a center of the light source 424 drawn through the center of the light source 260 and parallel with the z-axis is not coincident with the lens components of the transmitter mold component 224. The pill portion 232 is shown to include a pill portion center 420 that is offset relative to the light source center 424, thereby enabling the light emitted by the planar surface of the light source 260 to be directed away from the z-axis even though the light is initially transmitted from a light-emitting surface that is planar with the x-y plane.

In the depicted embodiment, lens components of the transmitter side 212 include wedge portion 228 and pill portion 232. The wedge portion 228 is shown to include a wedge rear face 404 and a wedge front face 408. The pill portion 232 is shown to include a cylindrical portion 412 and front end 416. The pill portion center 420 substantially bisects the cylindrical portion 412 of the pill portion 232. The wedge front face 408 interfaces with the cylindrical portion 412 such that a singular and integrated lens is created in the transmitter mold component. Along with the wedge rear face 404 and the front end 416 of the pill portion 232, light emitted by the light source 260 is bent toward the front face 116 of the housing 104. Thus, an object that is neither above the pill portion center 420 or the light source center 424 can be illuminated with light emitted by the light source 260. In some embodiments, an object can be illuminated by the light source 260 and detected by the light detector 252 even when the object is not positioned above the transmitter hole 124 and possibly when the object is positioned beyond the front face 116 of the sensor 100.

In some embodiments, the light source 260 is not aligned with the center of the substrate 204. Instead, the light source 260 is biased toward the back face 118 of the housing 104. Similarly, the light source 260 is biased toward the wedge portion 228 instead of the front end 416 of the pill portion 232. This particular configuration enables light emitted by the light source 260 to be directed at an angle that is offset relative to the z-axis toward the front face 116.

Also like the receiver hole 120, the transmitter hole 124 is shown to be biased toward the front face 116 of the housing 104. The offset of the transmitter hole 124 enables the bent light to be transmitted at the angle relative to the z-axis.

In some embodiments, the light source center 424 may not be exactly aligned with the light detector center 308 along the y-z plane; however, such a configuration could be possible. In other words, the light source center 424 may be closer or further away from the back face 118 than the light detector center 308 without departing from the scope of the present disclosure. Regardless of the relative position of the light source center 424 and light detector center 308, the configuration of the lens elements enables the viewing angle of the sensor 100 to be directed away from a plane extending between the light source center 424 and light detector center 308 that is substantially orthogonal to the top surface of the substrate 104 (which consequently may also be orthogonal to the light-emitting surface of the light source 260 of the light-detecting surface of the light detector 252). This means that objects do not have to be positioned over the sensor 100 (e.g., coincident with the lens center 304, light detector center 308, pill portion center 420, or light source center 424) to be detected by the sensor 100. Advantageously, however, the structure of the sensor 100 components can still be substantially planar with respect to the substrate 204 on which they are mounted. This enables the sensor 100 to achieve a highly compact form factor while also enabling an extended and directional viewing window, thereby making the sensor 100 highly desirable for use in a number of electronic devices.

Figure 5:
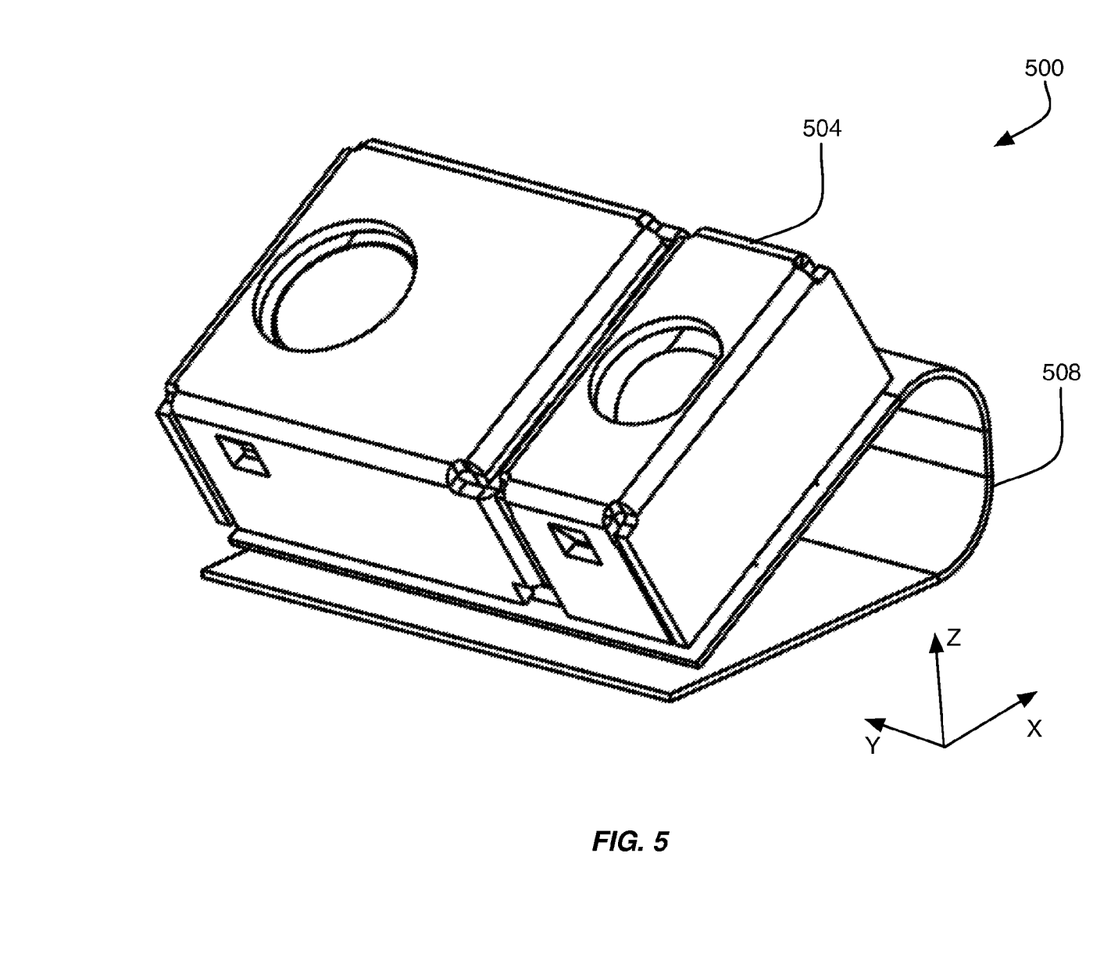
FIG. 5 depicts an isometric view of a sensor in accordance with embodiments of the present disclosure.

With reference now to FIGS. 5-8, alternative configurations to that already described in connection with sensor 100. In particular, FIG. 5 shows a sensor 500 configuration where a support 508 is used to tilt the entirety of the sensor package 504 away from the z-axis. This particular configuration can help achieve a directional sensor that views objects not directly above the base of the support 508. The support 508 can be used in combination with the sensor 100 configuration described above or the support 508 can be used with a traditional on-axis sensor package where the light emitted by the light source is emitted directly orthogonal to the light-emitting surface of the light source and objects are required to be directly above the light-emitting surface of the light source to be detected.

Figure 6:
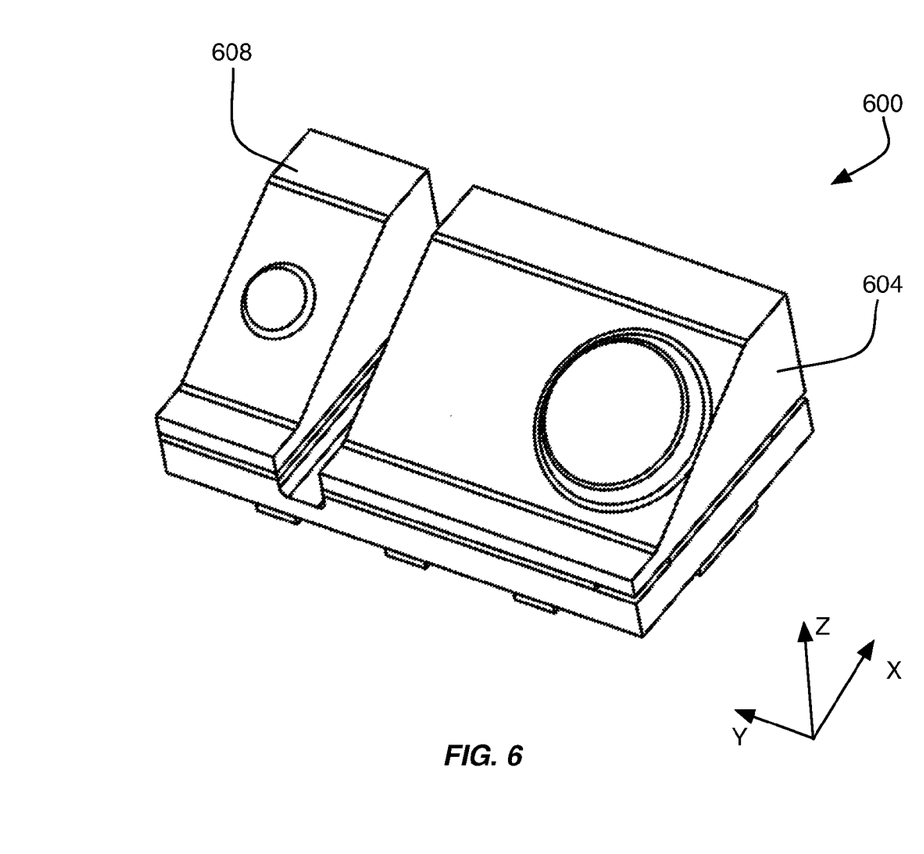
FIG. 6 depicts an isometric view of a sensor in accordance with embodiments of the present disclosure.

FIG. 6 depicts another sensor 600 configuration where a receiver wedge 604 and transmitter wedge 608 are used to tilt the lens components of the receiver and transmitter, respectively. The receiver wedge 604 may tilt or rotate the lens components contained therein away from the z-axis. Likewise, the transmitter wedge 608 may tilt or rotate the lens components contained therein away from the z-axis thereby enabling the detection of objects off-axis from the sensor 600.

Figure 7:
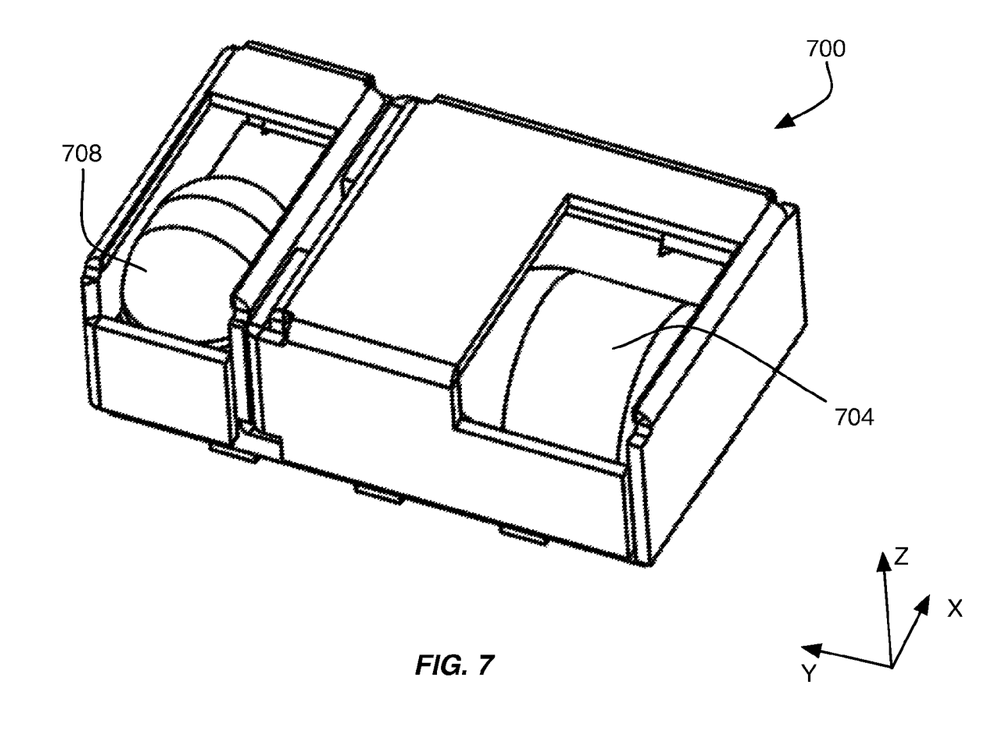
FIG. 7 depicts an isometric view of a sensor in accordance with embodiments of the present disclosure.

FIG. 7 depicts another sensor 700 configuration where alternative configurations of a receiver lens 704 and transmitter lens 708 are used to direct light away from the z-axis, thereby enabling the sensor 700 to detect objects positioned away from directly over the light source and/or light detector. In some embodiments, the receiver lens comprises a cylindrical or pill portion that has a longitudinal axis parallel with the y-axis. The transmitter lens 708 may also comprise a cylindrical or pill portion that has a longitudinal axis parallel with the x-axis. These lenses may help to direct the viewing angle of the sensor 700 toward the front face 116 of the housing; however, because a wedge portion is not used, the viewing range and/or viewing window may not be as large as the viewing window achieved by sensor 100.

Figure 8:
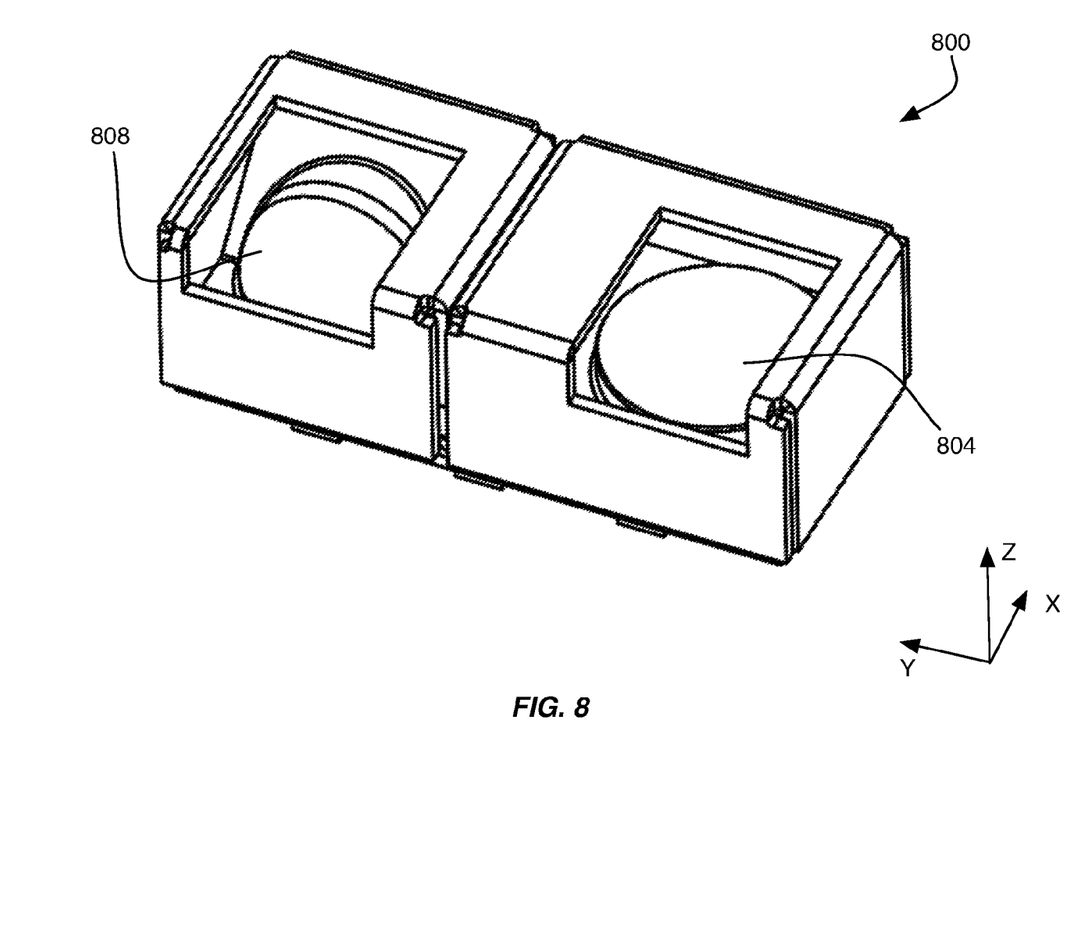
FIG. 8 depicts an isometric view of a sensor in accordance with embodiments of the present disclosure.

FIG. 8 depicts another sensor 800 configuration where a planar or dome-shaped receiver lens 804 is used in combination with a cylindrical transmitter lens 808. As with sensor 700, the configuration of sensor 800 may achieve a certain amount of off-axis object detection, but the range and viewing window of the sensor 800 may be limited as compared to the range and viewing window of sensor 100.

It should be appreciated that the sensors 500, 600, 700, and 800 may not be as compact and/or have the same viewing range/window as sensor 100.

With reference now to FIGS. 9A-D, additional capabilities of a sensor 904 incorporated into an electronic device 900 will be described in accordance with embodiments of the present disclosure. The sensor 904 may correspond to any of the sensors 100, 500, 600, 700, and/or 800 described herein above. In some embodiments, the sensor 904 may correspond to the sensor 100 configuration having a highly compact form factor as well as the ability to detect or sense an object 908 that is not aligned above the sensor 904 with respect to the z-axis.

Figure 9A:
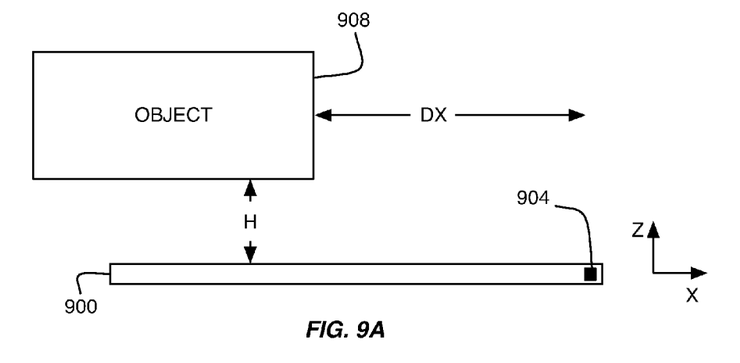
FIG. 9A depicts an elevational view of an electronic device incorporating a sensor in accordance with embodiments of the present disclosure.
Figure 9B:
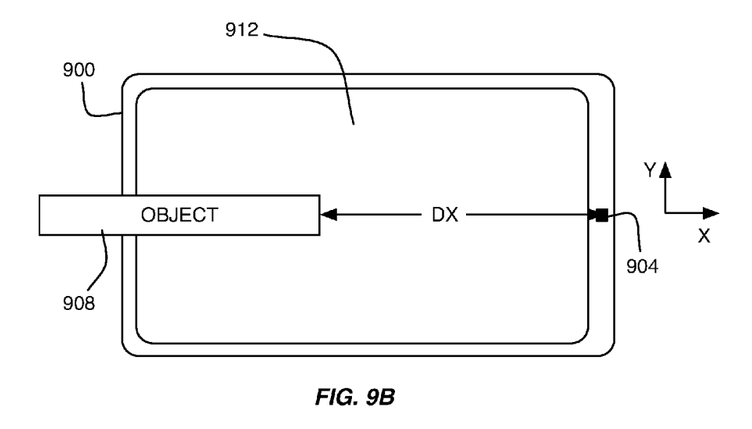
FIG. 9B depicts a top view an electronic device incorporating a sensor in accordance with embodiments of the present disclosure.

In some embodiments, the object 908 may correspond to any physical and/or movable element. As a non-limiting example, the object 908 may correspond to a limb, hand, finger, thumb, or the like of a user of the electronic device 900. Alternatively or additionally, the object 908 may correspond to a stylus or other object having a predetermined shape. In some embodiments, the sensor 904 is configured to detect a proximity of the object 908 relative to the sensor 904 and/or the electronic device 900. In some embodiments, the sensor 904 is configured to detect gesture inputs provided by a user by tracking a motion or series of motions of the object 908 relative to the sensor 904. Advantageously, proximity or gesture can be detected with the sensor 904 even though the object 908 is not positioned directly above the sensor 904.

In some embodiments, the object 908 does not have to cross the y-z plane that intersects the sensor 904, which may also be referred to herein as the primary sensor plane. In other embodiments, the primary sensor plane may not be exactly coincident with the y-z plane, but, instead, may coincide with a plane established substantially perpendicular to the major surface of the substrate 204 and along a line extending between the light source and light detector of the sensor 904. Another definition of the primary sensor plane may correspond to a plane that is perpendicular to the light-emitting surface of the light source (or the light-detecting surface of the light detector) and along a line extending between the light source and light detector of the sensor 904. Under any definition, the primary sensor plane may basically travel through the sensor 904 and be approximately parallel with the y-z plane.

Figure 9C:
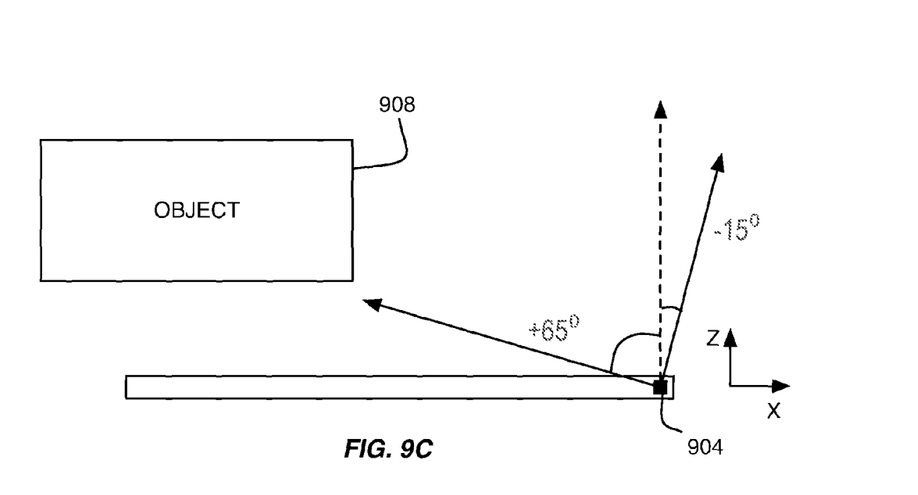
FIG. 9C depicts a field of view range of a sensor in accordance with embodiments of the present disclosure.
Figure 9D:
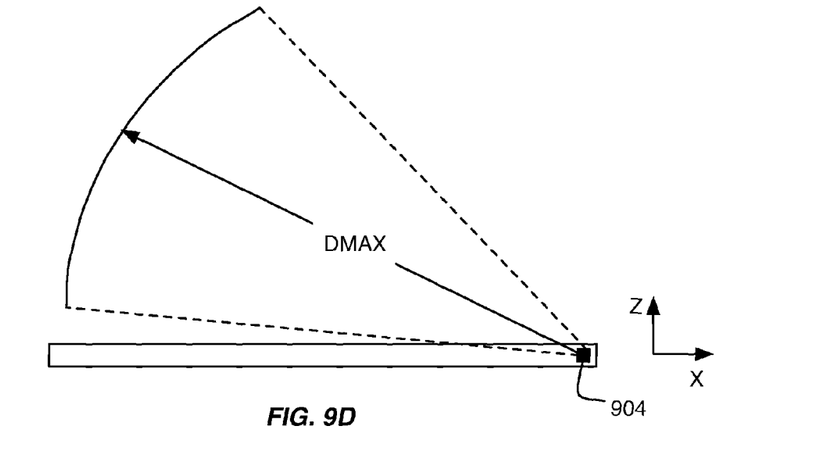
FIG. 9D depicts a viewing distance of a sensor in accordance with embodiments of the present disclosure.

In some embodiments, the object 908 can be illuminated and detected by the sensor 904 when the object is displaced from the primary sensor plane intersecting the sensor 904 by a distance of DX. As an example, DX may correspond to a distance of at least six (6) inches; thus, the object 908 can be detected when it is six (6) inches away from the primary sensor plane. The object 908 can also be detected when it is displaced from a display screen 912 of the electronic device 900 by a height of H. In some embodiments, the object 908 may be detected even if the object is positioned more than 15 degrees away from the primary sensor plane. As shown in FIG. 9D, the field of view of the sensor 904 does not even have to coincide with the primary sensor plane and the field of view may be at least 60 degrees wide. In other embodiments, the field of view of the sensor 904 may extend at least 80 degrees offset from the primary sensor plane (e.g., within 10 degrees of the display surface 912) and the field of view can extend at least 6 inches away from the primary sensor plane. This particular field of view substantially enables the detection of the object 908 over the display screen 912 instead of over the sensor 904, thereby increasing the potential gestures that can be captured with the sensor 904 for controlling operations of the electronic device 900.

In some embodiments, the sensor 904 can be configured to detect the object 908 by illuminating the object 908 with light from the light source and then detecting light that reflects off the object with the light detector. In some embodiments, the reflected light from the object 908 can be detected by the light detector even though the reflected light has an obtuse angle of incidence relative to the primary sensor plane (e.g., the y-z plane passing through the light source and light detector). Moreover, the field of view may include the primary sensor plane as shown in FIG. 9C, but the field of view is not required to coincide with the primary sensor plane as shown in FIG. 9D and the maximum detection distance DMAX for an object may be as far away as 20 cm or more even when the object 908 is offset from the primary sensor plane by 45 degrees. In some embodiments, the object 908 may be detected even when the reflected light detected at the light detector arrives at the light detector at an acute angle of incidence measured relative to the light-detecting surface of the light detector. The reflected light detected at the light detector may then be correlated to at least one of a proximity and gesture input.

Figure 10:
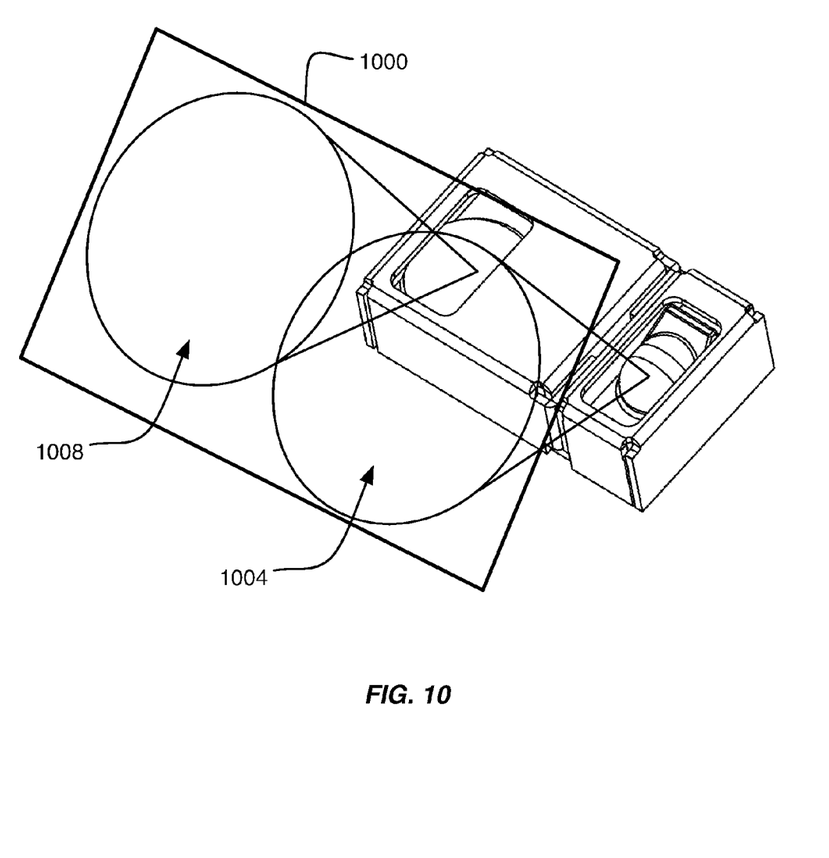
FIG. 10 depicts an image plane relative to a sensor in accordance with embodiments of the present disclosure.

FIG. 10 further illustrates the optical operation of a sensor according to embodiments of the present disclosure. In particular, a sensor is configured to create an illumination area 1004 that is off-axis relative to the light-emitting surface of the light source and also off-axis relative to the primary sensor plane passing through the light source and light detector. Likewise, the light detector is configured such that the receiver's view window 1008 is also off-axis, but substantially aligned with the transmitter illumination area 1004 in an image plane 1000. The image plane 1000 is neither orthogonal with the primary sensor plane nor is the image plane 1000 orthogonal with the light-emitting and/or light-detecting surfaces of the sensor's light source and/or light detector, respectively. Creating such an image plane 1000 enables the sensor to be utilized in a much more flexible manner than traditional light-based sensors.

Specific details were given in the description to provide a thorough understanding of the embodiments. However, it will be understood by one of ordinary skill in the art that the embodiments may be practiced without these specific details. For example, circuits may be shown in block diagrams in order not to obscure the embodiments in unnecessary detail. In other instances, well-known circuits, processes, algorithms, structures, and techniques may be shown without unnecessary detail in order to avoid obscuring the embodiments.

While illustrative embodiments of the disclosure have been described in detail herein, it is to be understood that the inventive concepts may be otherwise variously embodied and employed, and that the appended claims are intended to be construed to include such variations, except as limited by the prior art.

What is claimed is:

1. An optical sensor, comprising:
a substrate comprising a first major surface;
a light source mounted on the first major surface of the substrate and configured to emit illumination light away from the first major surface toward an object;
a light detector mounted on the first major surface of the substrate and configured to detect reflected light that is created as a result of the object being illuminated with the illumination light, wherein a primary sensor plane is established substantially perpendicular to the first major surface and along a line extending between the light source and light detector; and
a first optical element positioned between the light source and object, the first optical element being configured to project the illumination light away from the primary sensor plane such that the object is illuminated even when the object is positioned more than 15 degrees away from the primary sensor plane.

2. The optical sensor of claim 1, wherein the light detector comprises a field of view that does not coincide with the primary sensor plane.

3. The optical sensor of claim 2, wherein the field of view is at least 60 degrees wide.

4. The optical sensor of claim 2, wherein a bottom of the field of view is at least 80 degrees offset from the primary sensor plane.

5. The optical sensor of claim 2, wherein the field of view extends at least 6 inches away from the primary sensor plane.

6. The optical sensor of claim 1, further comprising:
a second optical element positioned between the object and the light detector, wherein the second optical element comprises a dome-shaped lens and wherein the light detector is not positioned beneath a center of the dome-shaped lens.

7. The optical sensor of claim 1, wherein the light source and light detector are positioned offset from a center axis of the substrate.

8. The optical sensor of claim 1, wherein the light source is mounted directly to the substrate.

9. The optical sensor of claim 1, wherein the first optical element comprises a lens with a wedge portion, a dome-shaped end, and a cylindrical section connecting the wedge portion with the dome-shaped end.

10. The optical sensor of claim 9, wherein the lens completely encapsulates the light source and wherein the lens comprises at least one of epoxy, silicone, a hybrid of silicone and epoxy, phosphor, a hybrid of phosphor and silicone, an amorphous polyamide resin or fluorocarbon, glass, and plastic.

11. A communication device comprising the optical sensor of claim 1.

12. An optical system for detecting at least one of proximity and gesture, the system comprising:
   a light source comprising a first major surface configured to emit illumination light toward an object;
   a light detector configured to detect reflected light that is created as a result of the object being illuminated with the illumination light, wherein a primary sensor plane is established substantially perpendicular to the first major surface and along a line extending between the light source and light detector, wherein the light detector comprises a field of view that does not coincide with the primary sensor plane;
   a first optical element positioned between the light source and the object, the first optical element being configured to project the illumination light away from the primary sensor plane such that the object is illuminated even when the object is positioned more than 15 degrees away from the primary sensor plane; and
   a second optical element positioned between the object and the light detector, wherein the second optical element is discrete and separate from the first optical element.

13. The system of claim 12, wherein the field of view is at least 60 degrees wide and offset from the primary sensor plane by at least 15 degrees.

14. The system of claim 12, wherein the field of view is offset from the primary sensor plane by at least 30 degrees.

15. The system of claim 12, wherein the detected reflected light is correlated to a gesture input.

16. The system of claim 12, wherein the reflected light detected at a light-detecting surface of the light detector comprises an angle of incidence as small as 10 degrees measured relative to the light-detecting surface of the light detector.

17. The system of claim 12, wherein the light source comprises a Light Emitting Diode (LED) and wherein the light detector comprises a photosensor positioned on an Integrated Circuit.

18. The optical sensor of claim 1, wherein the light source comprises a Light Emitting Diode (LED) and wherein the light detector comprises a photosensor positioned on an Integrated Circuit.

19. The optical sensor of claim 1, wherein the detected reflected light is correlated to a gesture input.

* * * * *